US005744961A

United States Patent [19]

Otaka

[11] Patent Number: 5,744,961

[45] Date of Patent: Apr. 28, 1998

[54] LAMP DISCONNECTION DETECTING DEVICE FOR IDENTIFYING A SPECIFIC LAMP WHICH HAS BECOME DISCONNECTED

[75] Inventor: Michihiro Otaka, Shizuoka, Japan

[73] Assignee: Yazaki Corporation, Tokyo, Japan

[21] Appl. No.: 741,118

[22] Filed: Oct. 30, 1996

[30] Foreign Application Priority Data

Nov. 1, 1995 [JP] Japan .................................... 7-285134

[51] Int. Cl.$^{6}$ ............................ G01R 31/02; G08B 21/00

[52] U.S. Cl. .......................... 324/403; 324/414; 340/642; 340/643

[58] Field of Search .................................... 324/403, 406, 324/414, 503, 654, 117 H; 340/641, 642, 643, 646; 307/10.8

[56] References Cited

U.S. PATENT DOCUMENTS

| | | | |
|---|---|---|---|
| 3,956,733 | 5/1976 | Sakurai | 340/643 X |
| 3,995,262 | 11/1976 | France et al. | 340/643 X |
| 4,189,662 | 2/1980 | Horng . | |
| 4,667,187 | 5/1987 | Volk et al. | 340/641 |
| 4,745,339 | 5/1988 | Izawa et al. | 340/641 X |
| 5,041,761 | 8/1991 | Wright et al. | 340/641 X |
| 5,254,971 | 10/1993 | Sutterlin et al. | 340/641 X |

FOREIGN PATENT DOCUMENTS

| | | | |
|---|---|---|---|
| 1-311927 | 12/1989 | Japan | B60Q 11/00 |

*Primary Examiner*—Ernest F. Karlsen
*Assistant Examiner*—Diep Do
*Attorney, Agent, or Firm*—Sughrue, Mion, Zinn, Macpeak & Seas, PLLC

[57] ABSTRACT

A lamp disconnection detecting device includes a magnetic core with a gap; a plurality of detecting coils the number of turns of which are different from one another and are proportional to $2^n$ (where n=0, or positive integers), and a magnetic response section provided in the gap of the magnetic core.

5 Claims, 3 Drawing Sheets

LAMP DISCONNECTION DETECTING DEVICE FOR IDENTIFYING A SPECIFIC LAMP WHICH HAS BECOME DISCONNECTED

BACKGROUND OF THE INVENTION

The present invention relates to a lamp disconnection detecting device which detects the disconnection of one or more of a plurality of lamps which are to be turned on at the same time, and identifies the lamps which were disconnected.

A tail lamp circuit as in FIG. 5 is an example of a circuit in which a plurality of lamps are to be turned on at the same time. In the tail lamp circuit, power lines L11, L12, L13 and L14 are parallel-connected through a lighting switch 15 to a power source, and front clearance lamps 11 and 12, and tail lamps 13 and 14 are connected to the power lines L11 and L12, and the power lines L13 and L14, respectively. Those lamps are equal in rating to one another. When the lighting switch 15 is turned on, the front clearance lamps 11 and 12, and the tail lamps 13 and 14 are all turned on, if they are normal. If any one of the lamps is disconnected, no current flows to the power line connected to the lamp thus disconnected. However, in general, a driver on a driver's seat will not notice the disconnection of those lamps because he cannot see them directly from the driver's seat. If the lamp thus disconnected is left as it is, then an unexpected accident may occur. Hence, it is necessary to provide a device which detects the disconnection of the lamps quickly.

A typical example of a lamp disconnection detecting device of this type has been disclosed, for instance, by Japanese Patent Unexamined Publication No. Hei 1-311927. The conventional lamp disconnection detecting device is generally indicated at 6 in FIG. 6. In FIG. 6, a pair of right and left lamps 62 and 61 are stop lamps which are equal in rating to each other, and are mounted on the right and left ends of the rear of a motor vehicle. Those lamps 61 and 62 are connected to power lines 6L1 and 6L2 which are arranged in parallel and connected through a lamp switch 63 to a power source B. When none of the lamps 61 and 62 are disconnected, currents flowing in the power lines 6L1 and 6L2 are equal. Between the lamp switch 63 and the lamps 61 and 61, the power lines 6L1 and 6L2 of the lamps 61 and 62 are partially in parallel with each other so that the currents therein are opposite to each other in the direction of flow. Those parallel portions of the power lines 6L1 and 6L2 are provided with a sensor 64 in such a manner that the latter 64 is positioned perpendicular to the power lines 6L1 and 6L2. The sensor 64 is made up of a Hall element which, when a conductor in which current is flowing is placed in a magnetic field, generates a voltage in a direction which is perpendicular to both the current and the magnetic field. The output voltage of the sensor 64 is detected by a detecting section 65, so that a warning lamp 67 is turned on which is connected through a transistor 66 to the detecting section 65.

When the lamp switch 63 is turned on, the output current of the power source B flows in the lamps 61 and 62, so that those lamps are turned on. In this connection, it should be noted that, as was described above, the power lines 6L1 and 6L2 of the lamps 61 and 62 are so arranged that the currents therein are opposite in the direction of flow to each other, and the sensor 64 made up of the Hall element embraces those power lines. Hence, in the case where both of the lamps 61 and 62 are normal (not disconnected), the magnetic fields generated by the power lines 6L1 and 6L2 are canceled out by each other, so that the sensor 64 produces no Hall voltage. However, in the case where one of the lamps 61 and 62 is disconnected, the balance in magnetic field is lost, so that the sensor outputs a Hall voltage. The Hall voltage thus outputted is detected by the detecting section 65, so that the transistor 66 is rendered conductive to turn on the warning lamp 67.

The above-described device is able to give the alarm for the fact that any one of the two lamps 61 and 62 has been disconnected; however, it is impossible for the device to determine which of the lamps has been disconnected. On the other hand, there may be a case where both of the lamps 61 and 62 are disconnected. In this case, the power lines generate no magnetic fields, and therefore the sensor produces no Hall voltage similarly as in the above-described case where the magnetic fields are generated in balance with each other. Hence, in this case, the warning lamp 67 is not turned on. Furthermore, the conventional device is not applicable to the detection of the disconnection of an odd number of lamps (more than two lamps), and cannot identify which of an even number of lamps has been disconnected.

SUMMARY OF THE INVENTION

Accordingly, an object of the invention is to eliminate the above-described difficulties accompanying a conventional lamp disconnection detecting device. More specifically, an object of the invention is to provide a lamp disconnection detecting device which is able to detect the disconnection of one or more of a plurality of lamps which are to be tuned on at the same time, and to identify the lamps which were disconnected.

The foregoing object of the invention has been achieved by the provision of a lamp disconnection detecting device which, according to the invention, comprises: a magnetic core with a gap; a plurality of detecting coils the number of turns of which are different from one another and are proportional to $2^n$ (where n=0, or positive integers), and a magnetic response section provided in the gap of the magnetic core.

In order to apply the lamp disconnection detecting device to a lamp lighting circuit adapted to supply electric current from a power source to a plurality of lamps the disconnection of which is detected, the electric current flowing into the lamps are caused to flow through the detecting coils different in the number of turns.

Furthermore, in the device, a detecting section for detecting the magnitude of an output of the magnetic response section is provided on the output side of the magnetic response section, and a display section for making display according to a detection output of the detecting section is provided on the output side of the detecting section, so that a lamp or lamps which were disconnected can be visually detected.

DETAILED DESCRIPTION OF THE INVENTION

Preferred embodiments of the invention will be described with reference to the accompanying drawings.

Figure 1:
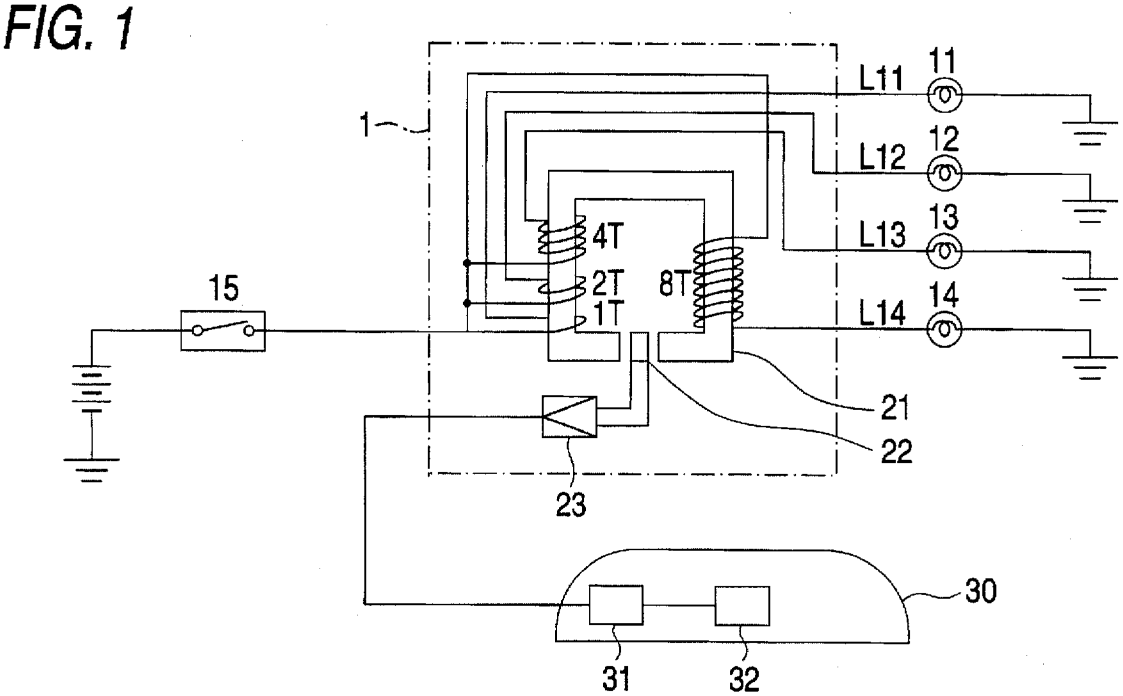
FIG. 1 is a circuit diagram showing an example of a lamp disconnection detecting device applied to the plural lamp lighting circuit of FIG. 5, which constitutes a first embodiment of the invention.
Figure 2:
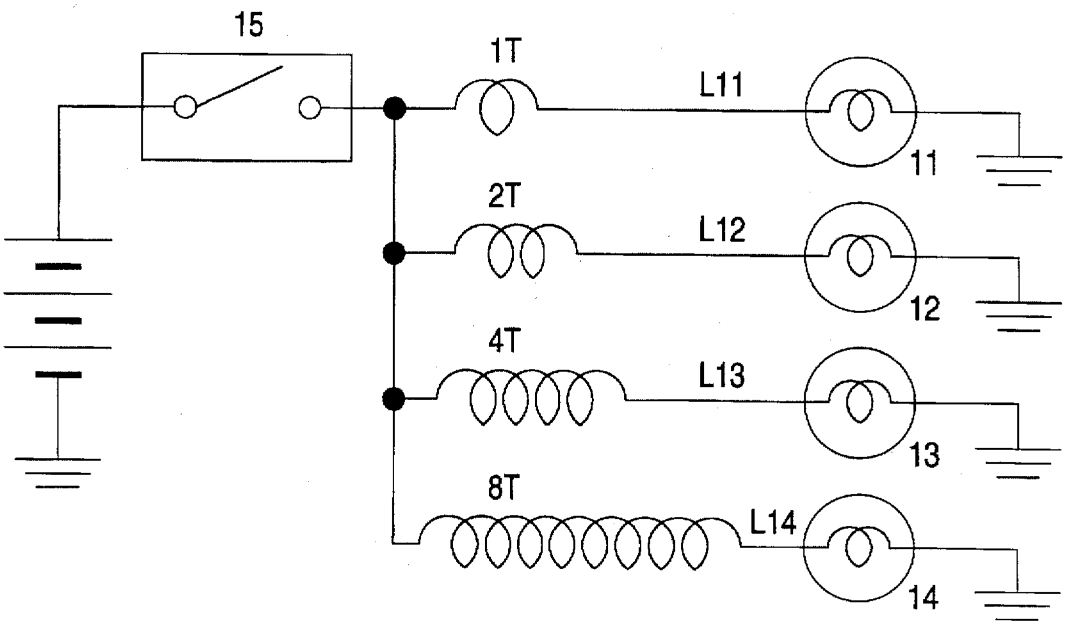
FIG. 2 is an equivalent circuit diagram of the lamp disconnection detecting device shown in FIG. 1.
Figure 3:
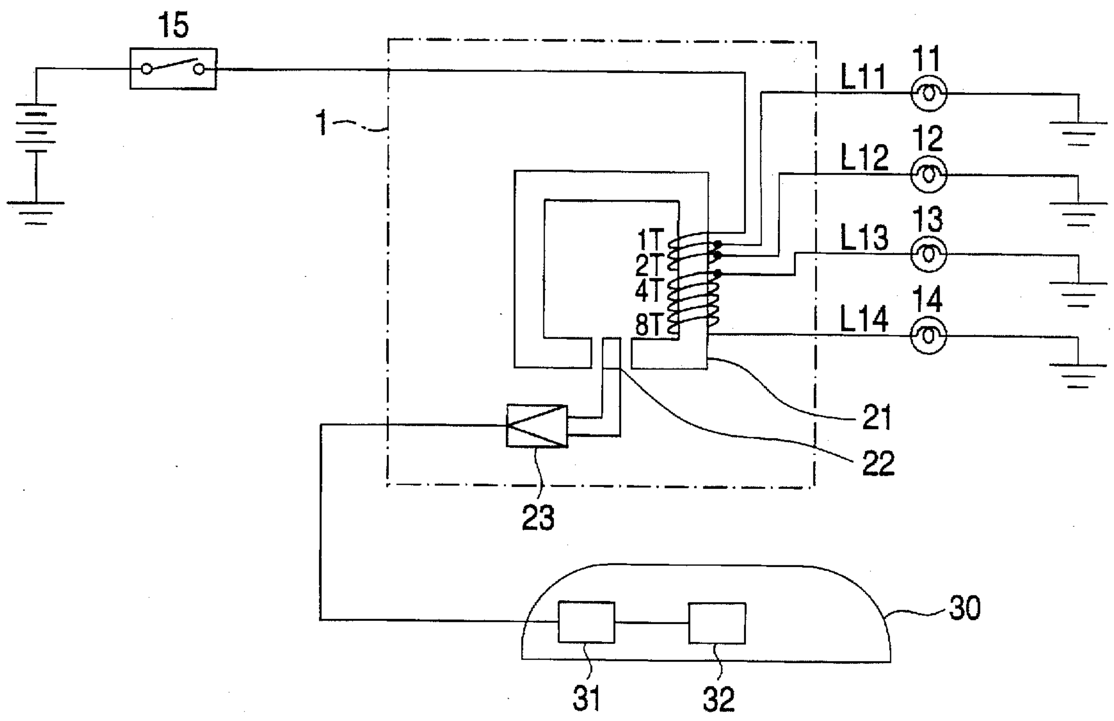
FIG. 3 is a circuit diagram showing another example of the lamp disconnection detecting device applied to the circuit of FIG. 5, which constitutes a second embodiment of the invention.
Figure 4:
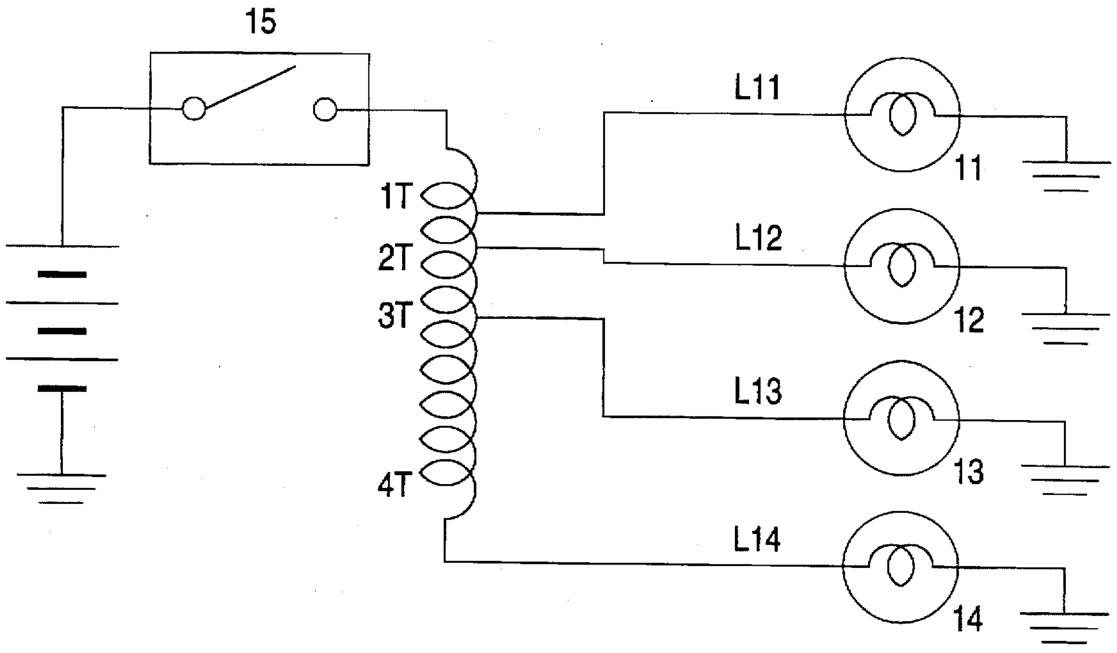
FIG. 4 is an equivalent circuit of the lamp disconnection detecting device shown in FIG. 3.
Figure 5:
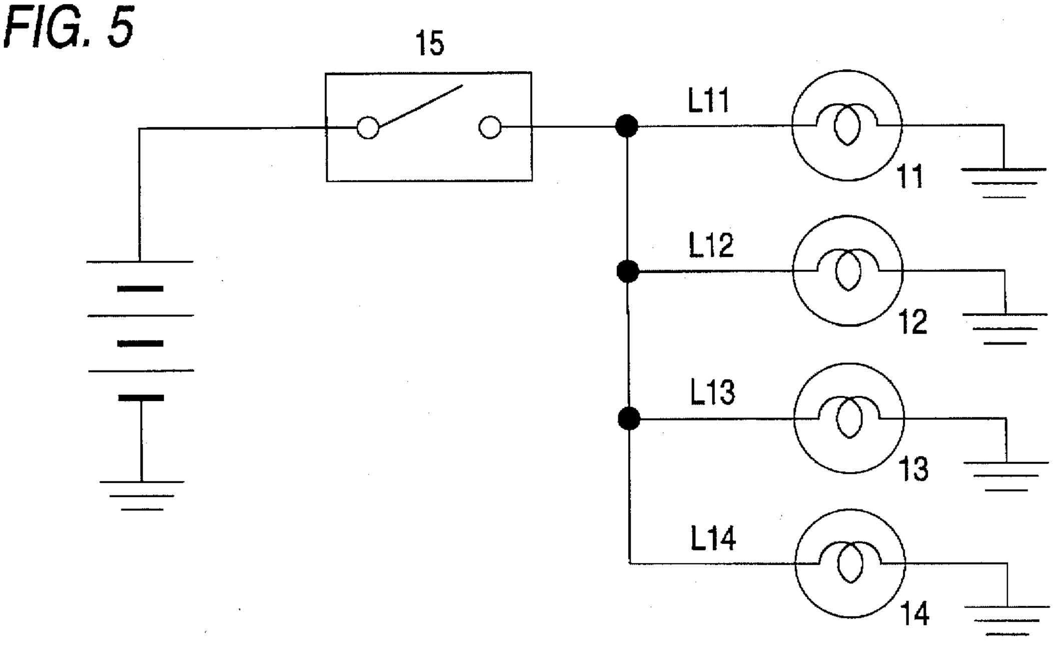
FIG. 5 is a tail lamp circuit diagram which is an example of a lamp circuit in which all the lamps are turned on at the same time.
Figure 6:
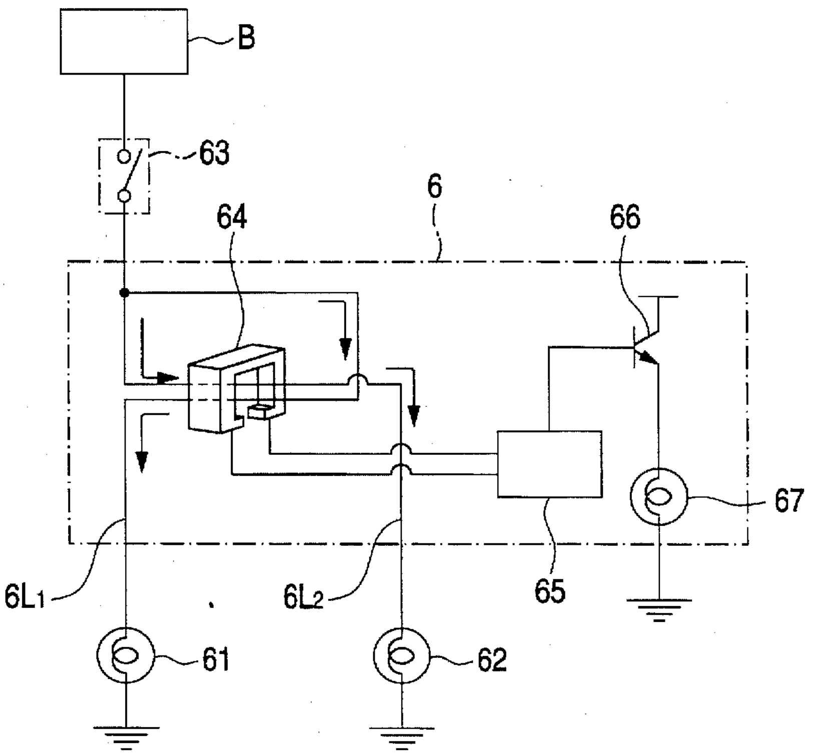
FIG. 6 PRIOR ART
FIG. 6 is a diagram showing a conventional lamp disconnection detecting device.

FIG. 1 is a circuit diagram showing an example of a lamp disconnection detecting device applied to the plural lamp lighting circuit of FIG. 5, which constitutes a first embodiment of the invention. FIG. 2 is an equivalent circuit diagram of the lamp disconnection detecting device shown in FIG. 1. FIG. 3 is a circuit diagram showing another example of the lamp disconnection detecting device applied to the circuit of FIG. 5, which constitutes a second embodiment of the invention. FIG. 4 is an equivalent circuit diagram of the lamp disconnection detecting device shown in FIG. 3. FIG. 5 is a tail lamp circuit diagram which is an example of a lamp circuit in which all the lamps are to be turned on at the same time.

In FIG. 1, reference numeral 1 designates the lamp disconnection detecting device which is the first embodiment of the invention. The device 1 includes a magnetic core 21 with a gap. Lamps 11, 12, 13 and 14 are connected to power lines L11, L12, L13 and L14, respectively, which are wound on the magnetic core 21 one turn (1T), two turns (2T), four turns (4T) and eight turns (8T), respectively. That is, coils are formed by winding the power lines L11, L12, L13, and L14 in FIG. 5 (hereinafter referred to as "primary coils 1T, 2T, 4T and 8T", respectively, when applicable). Thus, the resultant circuit is as shown in FIG. 2; that is, it is equivalent to the circuit which is obtained by connecting the primary coils 1T, 2T, 4T and 8T respectively to the power lines L11, L12, L13 and L14 in FIG. 5. A Hall element 22 is set in the gap of the magnetic core 21. The Hall element 22 provides a Hall voltage which is proportional to the sum of the magnetic flux outputs of the power lines. Hence, the Hall voltage is represented by the following Equation (1):

$$V_H = K \times \phi_{total} \times \phi_1 \quad (1)$$

where $V_H$ is the Hall voltage, $\phi_{total}$ is the sum of the magnetic flux outputs of the power lines, $\phi_1$ is the magnetic flux produced by a coil of one turn (or multiple turns), and K is a proportional constant.

In general, a Hall voltage is considerably low. Therefore, an amplifier 23 is connected to the output side of the Hall element 22. The output voltage of the amplifier 23 is applied to a detecting section 31 in a meter 30. The detecting section 31 detects the voltage and determines it from the magnitude of the voltage thus detected whether or not the lamp has been disconnected. The lamp disconnected, if any, is indicated on a display unit 32 in the meter 30.

A method of determining it from the magnitude of the detected voltage which of the lamps has been turned out, is as follows:

(1) In the case where all the lamps are normal

In the case where all the lamps are normal (not disconnected), current flows in all the power lines L11, L12, L13 and L14, and therefore their primary coils 1T, 2T, 4T and 8T produce magnetic flux. If it is assumed that the power line L11 produces a magnetic flux output $\phi_1$ in the magnetic core, then the power lines L12, L13 and L14 provide magnetic flux outputs $2\times\phi_1$, $4\times\phi_1$, and $8\times\phi_1$, because their numbers of turns are 2T, 4T and 8T, respectively. The total magnetic flux produced in the magnetic core 21 is the sum of those magnetic flux outputs; i.e., $15\times\phi_1$. Hence, the Hall voltage outputted by the Hall element 22 is represented by the following Equation (2):

$$\text{Hall voltage } V_H = K \times 15 \times \phi_1 \quad (2)$$

(2) In the case where only one lamp is disconnected (2-1) Only the lamp 11 is disconnected The magnetic flux output which is provided by the current flowing in the lamp 11 is $\phi_1$. Hence, in the case where only the lamp 11 is disconnected, the total magnetic flux produced in the magnetic core 21 is smaller as much as $\phi_1$ than in the case where all the lamps are turned on. Hence, the total magnetic flux produced in the magnetic core 21 is $14\times\phi_1$. That is, the Hall voltage $V_H$ outputted by the Hall element is represented by the following Equation (3):

$$\text{Hall voltage } V_H = K \times 14 \times \phi_1 \quad (3)$$

(2-2) Only the lamp 12 is disconnected

The magnetic flux output which is provided by the current flowing in the lamp 12 is $2\times\phi_1$. Hence, in the case where only the lamp 12 is disconnected, the total magnetic flux produced in the magnetic core 21 is smaller as much as $2\times\phi_1$ than in the case where all the lamps are turned on. Hence, the total magnetic flux produced in the magnetic core 21 is $13\times\phi_1$. That is, the Hall voltage $V_H$ outputted by the Hall element is represented by the following Equation (3):

$$\text{Hall voltage } V_H = K \times 13 \times \phi_1 \quad (4)$$

(2-3) Only the lamp 13 or 14 is disconnected

In this case, the technical concept is the same as that in the above-described cases (2-1) and (2-2).

(3) In the case where two lamps are disconnected (3-1) The lamps 11 and 12 are disconnected In this case, the magnetic flux output $\phi_1$ provided by the current flowing in the lamp 11 and the magnetic flux output $2\times\phi_1$ provided by the current flowing in the lamp 12 are eliminated, so that the total magnetic flux produced in the magnetic core 21 is smaller as much as $3\times\phi_1$ than in the case where all the lamps are turned on. Hence, the total magnetic flux in the core 21 is $12\times\phi_1$, and the Hall voltage $V_H$ outputted by the Hall element is represented by the following Equation (5):

$$\text{Hall voltage } V_H = K \times 12 \times \phi_1 \quad (5)$$

(3-2) Two lamps in other combinations are disconnected

The technical concept is the same as in the above-described case (3-1).

(4) In the case where three lamps are disconnected (4-1) The lamps 11, 12 and 13 are disconnected In this case, the magnetic flux output $\phi_1$, provided by the current flowing in the lamp 11, the magnetic flux output $2\times\phi_1$ provided by the current flowing in the lamp 12, and the magnetic flux output $4\times\phi_1$ provided by the current flowing in the lamp 13 are eliminated, so that the total magnetic flux produced in the magnetic core 21 is smaller as much as $7\times\phi_1$ than in the case where all the lamps are turned on. Hence, the total magnetic flux in the core 21 is $15\times\phi_1-7\times\phi_1=8\times\phi_1$, and the Hall voltage $V_H$ outputted by the Hall element is represented by the following Equation (6):

$$\text{Hall voltage } V_H=K\times 8\times\phi_1 \quad (6)$$

(4-2) Three lamps in other combinations are disconnected

The technical concept is the same as in the above-described case (4-1).

(5) In the case where all the lamps are disconnected

In the case where all the lamps are disconnected, the total magnetic flux $15\times\phi_1$ is not present, and accordingly the Hall voltage $V_H$ is zero.

The above-described cases are summarized in the following Table 1:

a Hall voltage proportional to the magnetic flux produced by the coil. In general, a Hall voltage is considerably low. Therefore, an amplifier 23 is connected to the output side of the Hall element 22. The output voltage of the amplifier 23 is applied to a detecting section 31 in a meter 30. The detecting section 31 detects the voltage and determines it from the magnitude of the voltage thus detected whether or not any lamp has been disconnected. The lamp disconnected, if any, is indicated on a display unit 32 in the meter 30.

Now, a method of determining it from the magnitude of a Hall voltage which of the lamps is disconnected, will be described.

(1) In the case where none of the lamps are disconnected

In the case where none of the lamps are disconnected (all the lamps are normal), current flows in the power lines L11, L12, L13, and L14, and therefore their primary coils 1T, 2T,

TABLE 1

Total magnetic flux ratio (x = Disconnection)

| | Normal | One lamp is disconnected | | | | Two lamps are disconnected | | | | | | Three lamps are disconnected | | | | Four lamps are disconnected |
|---|---|---|---|---|---|---|---|---|---|---|---|---|---|---|---|---|
| Lamp 11 | 1 | x | 1 | 1 | 1 | x | x | x | 1 | 1 | 1 | x | x | x | 1 | x |
| Lamp 12 | 2 | 2 | x | 2 | 2 | x | 2 | 2 | x | x | 2 | x | x | 2 | x | x |
| Lamp 13 | 4 | 4 | 4 | x | 4 | 4 | x | 4 | x | 4 | x | x | 4 | x | x | x |
| Lamp 14 | 8 | 8 | 8 | 8 | x | 8 | 8 | x | 8 | x | x | 8 | x | x | x | x |
| Total magnetic flux | 15 | 14 | 13 | 11 | 7 | 12 | 10 | 6 | 9 | 5 | 3 | 8 | 4 | 2 | 1 | 0 |

Table 1 shows all the combinations of the lamps which may be disconnected, and the total magnetic flux in each of the combinations of the lamps thus disconnected is indicated in the lowest row. As is seen from those data in Table 1, different combinations of disconnected lamps correspond to different total magnetic flux outputs.

In the lamp disconnection detecting device of the invention, the power lines of the lamps are wound on the magnetic core in different numbers of turns which are proportional to $2^n$ (where n=0, or positive integers). Hence, the magnetic flux outputs provided by the primary coils of the power lines of four lamps change in a multiple of two: $\phi_1$, $2\times\phi_1$, $4\times\phi_1$, and $8\times\phi_1$. Hence, when lamps are disconnected in different combinations, different total magnetic flux outputs $\phi_{total}$ are detected, and accordingly the Hall voltage $V_H$ based on the latter are also different. Hence, by detecting the magnitude of the Hall voltage $V_H$, the lamp disconnected can be identified. The result of identification is displayed on the display unit 32 to warn the driver of the disconnection of the lamp or lamps.

Now, another example of the lamp disconnection detecting device, which constitutes a second embodiment of the invention, will be described with reference to FIGS. 3 and 4. FIG. 3 is the lamp disconnection detecting device, which is the second embodiment, applied to the circuit of FIG. 5. FIG. 4 is an equivalent circuit diagram of the lamp disconnection detecting device shown in FIG. 3.

As shown in FIG. 3, a power line L14 connected to the lamp 14 is wound in eight turns (8T) on the magnetic core 21 with the gap; that is, a coil of eight turns is formed. The first turn (1T), the second turn (2T), and the fourth turn (4T) of the coil are connected to the power lines L11, L12 and L13 of the lamps 11, 12 and 13, respectively. A hall element 22 is set in the gap of the magnetic core 21, so as to output 4T and 8T produce magnetic flux outputs. If it is assumed that the power line L11 produces a magnetic flux output $\phi_1$ in the magnetic core, then the power lines L12, L13 and L14 produce magnetic flux outputs $2\times\phi_1$, $4\times\phi_1$, and $8\times\phi_1$, respectively, because their numbers of turns are two (2T), four (4T) and eight (8T). Hence, the magnetic flux produced in the magnetic core 21 is $15\times\phi_1$. In response to the magnetic flux of $15\times\phi_1$, the Hall element 22 provides the following Hall voltage $V_H$:

$$\text{Hall voltage } V_H=K\times 15\times\phi_1 \quad (7)$$

where K is a constant.

(2) In the case where only the lamp 11 is disconnected

In the case where only the lamp 11 is disconnected, the magnetic flux produced in the magnetic core 21 is smaller as much as $\phi_1$ than in the case where all the lamps are turned on, because the current flowing in the lamp 11 produces an magnetic flux output $\phi_1$. Therefore, the total magnetic flux produced in the magnetic core is $14\times\phi_1$, and the Hall voltage $V_H$ outputted by the Hall element 22 is represented by the following Equation (8):

$$\text{Hall voltage } V_H=K\times 14\times\phi_1 \quad (8)$$

(3) In the case where two lamps are disconnected, and so forth

The technical concept is the same as in the above-described first embodiment. And the aforementioned Table 1 is applicable to all the combinations of the lamps disconnected. That is, when lamps are disconnected in different combinations, different total magnetic flux outputs are detected, and accordingly Equation (1) is applicable to the Hall voltage $V_H$ outputted by the Hall element. Hence, different Hall voltages $V_H$ are detected for the disconnection of the lamps in different combinations.

Therefore, by detecting the magnitude of the Hall voltage $V_H$, the lamp or lamps which have been disconnected can be identified. The result of identification is displayed on the display unit 32 to warn the driver of the disconnection of the lamp or lamps.

Instead of the display unit, an alarm device such as a buzzer may be employed so that the driver auditorially notices the disconnection of a lamp. In this case, it is preferable that the buzzer is so designed that it outputs sounds different in frequency, period, tone and/or amplitude, to identify the lamps.

As was described above, in the lamp disconnection detecting device of the invention, the magnetic core has a plurality of detecting coils the number of turns of which are different from one another and are proportional to $2^n$ (where n=0, or positive integers). Hence, with the device, the disconnection of one or more of the plurality of lamps which are to be turned on at the same time can be detected, and the disconnected lamps can be identified.

What is claimed is:

1. A lamp disconnection detecting device comprising:

a magnetic core with a gap;

a plurality of detecting coils for detecting disconnection wound around said magnetic core, the number of turns of said plurality of detecting coils being different from one another and proportional to $2^n$, where n=0 or positive integers; and a magnetic response section provided in said gap of said magnetic core for sensing a magnetic flux produced by current flowing through said detecting coils.

2. A lamp disconnection detecting device as claimed in claim 1, wherein said plurality of detecting coils are individually electrically connected to a plurality of lamps, respectively, such that a specific identity of a disconnected one or more of said plurality of lamps can be detected.

3. A lamp disconnection detecting device as claimed in claim 2, further comprising:

a detecting section for detecting a magnitude of a voltage output of said magnetic response section, said detecting section being provided on an output side of said magnetic response section, and a display section, responsive to said detecting section, for displaying information regarding which of said plurality of lamps is not receiving electrical current, said display section being provided on an output side of said detecting section.

4. The lamp disconnection detecting device of claim 1, wherein said plurality of detecting coils include common turns.

5. The lamp disconnection detecting device of claim 1, wherein said plurality of detecting coils are separate from one another.

* * * * *